United States Patent
Chen

(10) Patent No.: US 7,696,008 B2
(45) Date of Patent: Apr. 13, 2010

(54) WAFER-LEVEL CHIP PACKAGING PROCESS AND CHIP PACKAGE STRUCTURE

(75) Inventor: Chien-Yu Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 574 days.

(21) Appl. No.: 11/616,901

(22) Filed: Dec. 28, 2006

(65) Prior Publication Data

US 2007/0158673 A1    Jul. 12, 2007

(30) Foreign Application Priority Data

Jan. 5, 2006    (TW) .............................. 95100424 A

(51) Int. Cl.
H01L 21/00 (2006.01)
H01L 21/40 (2006.01)

(52) U.S. Cl. .................. 438/108; 257/621; 257/781

(58) Field of Classification Search ............. 257/621, 257/781; 438/108
See application file for complete search history.

(56) References Cited

U.S. PATENT DOCUMENTS

2006/0071347 A1 *  4/2006  Dotta ..................... 257/781
2006/0151847 A1 *  7/2006  Kwon et al. .............. 257/433

FOREIGN PATENT DOCUMENTS

TW    508789    11/2002
TW    1239082    9/2005

* cited by examiner

Primary Examiner—Ha Tran T Nguyen
Assistant Examiner—Aaron A Dehne
(74) Attorney, Agent, or Firm—Jiang Chyun IP Office

(57) ABSTRACT

A wafer-level chip packaging process includes the following steps. First, a wafer having a plurality of chip units, an active surface, and a corresponding back surface is provided. Each chip unit has a plurality of pads on the active surface. Next, a plurality of through holes is formed under the pads. The through holes are filled with a conductive material such that the conductive material within each through hole is electrically connected to corresponding one of the pads and a portion of the conductive material is exposed and protrudes from the back surface of the wafer. Thereafter, a transparent adhesive layer is formed on the active surface. Next, a transparent cover panel is disposed on the transparent adhesive layer such that the transparent cover panel is connected to the wafer through the transparent adhesive layer. Afterwards, a singulation step is performed to form a plurality of independent chip package structures.

6 Claims, 3 Drawing Sheets

WAFER-LEVEL CHIP PACKAGING PROCESS AND CHIP PACKAGE STRUCTURE

CROSS-REFERENCE TO RELATED APPLICATION

This application claims the priority benefit of Taiwan application serial no. 95100424, filed Jan. 5, 2006. All disclosure of the Taiwan application is incorporated herein by reference.

BACKGROUND OF THE INVENTION

1. Field of the Invention

The present invention relates to a packaging process and a package structure, and more particularly to a wafer-level chip packaging process and a chip package structure.

2. Description of Related Art

In the semiconductor production industry, the fabrication of integrated circuits (IC) is mainly divided into three stages: a wafer processing stage, an IC processing stage and an IC packaging stage. To fabricate a silicon chip, a series of steps including wafer fabrication, circuit design, mask making and wafer sawing have to be performed. After the contacts of each chip cut out from a wafer are electrically connected to an external carrier, the chip is encapsulated by using a molding compound. The purpose of packaging the chip is to protect the chip against the effects of moisture, heat and noise and provide a medium of connection between the chip and the external carrier.

However, the conventional IC package is formed by performing a wire bonding process or a flip chip bonding process to electrically connect the contacts on the chips with the corresponding external carriers and then encapsulating each chip with molding compound after the chips are separated in a wafer sawing process. Therefore, before the chip is encapsulated with molding compound, external particles can easily fall on the chip and lower its process yield. Moreover, the foregoing packaging process often incurs a higher cost.

To resolve the above problem, another conventional chip package structure is shown in FIG. 1. The chip package 100 includes a chip 110, a transparent cover panel 120, a spacer 130 and an adhesive layer 140. The chip 110 has a light-sensing area 114 on an active surface 112 and a plurality of pads 116 around the light-sensing area 114. In addition, the adhesive layer 140 encapsulates the spacer 130. Therefore, the transparent cover panel 120 is disposed above the active surface 112 through the support of the spacer 130 and the adhesion of the adhesive layer 140.

However, the adhesive layer 140 of the conventional chip package 100 normally has residual voids or bubbles. Moreover, there is a gap S between the transparent cover panel 120 and the chip 110. If some residual particles are lodged in the gap S during the packaging process, the particles may contaminate or scratch the light-sensing area 114 and cause a change of the path of incident light signals. Consequently, the light-sensing area 114 may receive distorted light signals. As a result, there is a need to improve the structure of the chip package.

SUMMARY OF THE INVENTION

Accordingly, the present invention is directed to a wafer-level chip packaging process capable of reducing voids or bubbles inside a transparent adhesive layer so that the possibility of particles scratching or contaminating an active surface may be effectively reduced.

The present invention is also directed to a chip package structure with a transparent adhesive layer having fewer number of residual voids or bubbles and capable of fully protecting a light-sensing area on an active surface of the chip.

The present invention provides a wafer-level chip packaging process comprising the following steps. First, a wafer is provided. The wafer has a plurality of chip units, an active surface, and an opposite back surface. A plurality of pads are disposed on the active surface. Next, a plurality of through holes are formed under the pads. Next, the through holes are filled with a conductive material such that the conductive material within each through hole is electrically connected to corresponding one of the pads and a portion of the conductive material is exposed and protrudes from the back surface of the wafer. Thereafter, a transparent adhesive layer is formed on the active surface. Next, a transparent cover panel is disposed on the transparent adhesive layer such that the transparent cover panel is connected to the wafer through the transparent adhesive layer. Afterwards, a singulation step is performed such that each chip unit with a corresponding part of the transparent cover panel is separated from others to form a plurality of independent chip package structures.

In an embodiment of the present invention, the method of forming the through holes includes etching.

In an embodiment of the present invention, the method of filling the through holes with conductive material includes printing.

In an embodiment of the present invention, the method of filling the through holes with conductive material includes plating.

In an embodiment of the present invention, the method of forming the transparent adhesive layer includes spin coating.

In an embodiment of the present invention, a step of curing the transparent adhesive layer may be performed after the step of disposing the transparent cover panel on the transparent adhesive layer in the wafer-level chip packaging process.

The present invention also provides a chip package structure comprising a silicon substrate, a transparent adhesive layer and a transparent cover panel. The silicon substrate has an active surface and a corresponding back surface. The active surface has a plurality of pads and the silicon substrate has a plurality of through holes under the pads. A conductive material is disposed inside the through holes and protrudes from the back surface of the silicon substrate. Furthermore, the transparent adhesive layer is disposed on the active surface, and the transparent cover panel is disposed on the transparent adhesive layer so that the transparent cover panel is connected to the silicon substrate through the transparent adhesive layer.

In an embodiment of the present invention, the active surface of the silicon substrate may include a light-sensing area. Furthermore, the light-sensing area has a photo diode array therein.

In an embodiment of the present invention, the active surface of the silicon substrate may include a light-sensing area. Furthermore, the light-sensing area has a photo diode array therein. In addition, the pads may be disposed around the light-sensing area and electrically connected to the photo diode array.

In an embodiment of the present invention, the material forming the pads includes aluminum.

In an embodiment of the present invention, the conductive material includes solder.

Accordingly, in the wafer-level packaging process of the present invention, since the transparent adhesive layer formed by the spin coating method is evenly spread over the active surface, the probability of forming residual voids or bubbles inside the transparent adhesive layer is significantly reduced. Furthermore, the transparent adhesive layer can protect the entire active surface. In addition, because the transparent adhesive layer in the chip package structure of the present invention has fewer residual voids or bubbles and completely encapsulates the active surface, and therefore the path of incident light signals may not be adversely affected. Moreover, the transparent adhesive layer can fully protect the light-sensing area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
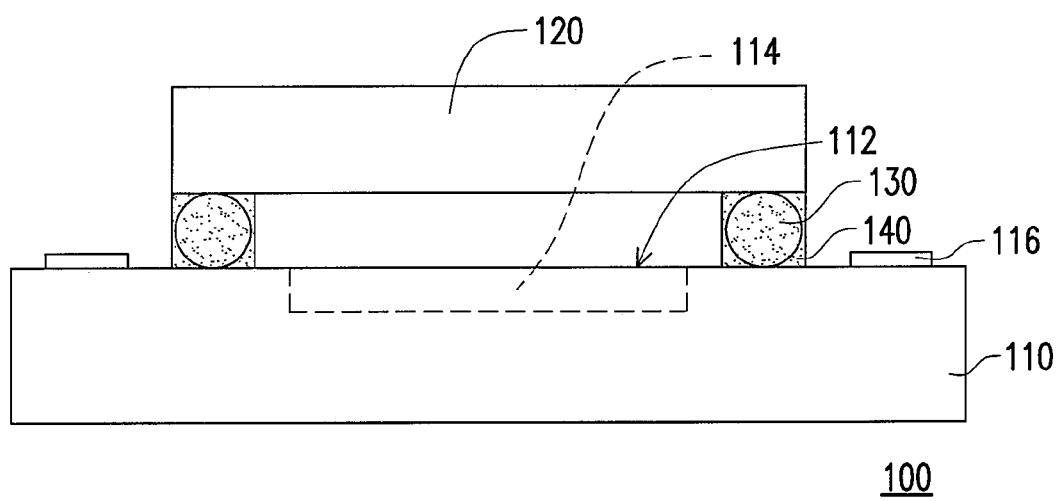
FIG. 1 is a schematic diagram of a conventional chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
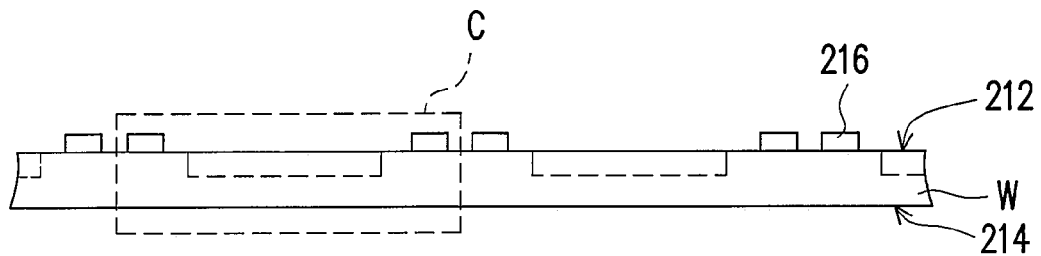
FIGS. 2A through 2F are side and schematic views showing the steps in a wafer-level chip packaging process.

FIGS. 2A through 2F are side and schematic views showing the steps in a wafer-level chip packaging process. The wafer-level chip packaging process in the present embodiment includes the following steps. First, as shown in FIG. 2A, a wafer W is provided. The wafer W includes a plurality of chip units C. Furthermore, the wafer W has an active surface 212 and an opposite back surface 214. A plurality of pads 216 are disposed on the active surface 212. The material forming the pads 216 includes aluminum, for example.

Figure 2B:
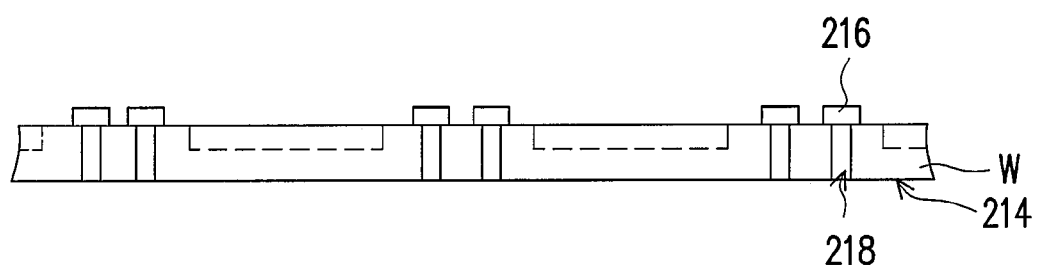

Next, as shown in FIG. 2B, a plurality of through holes 218 are formed under the pads 216. In the present embodiment, the method of forming the through holes 218 includes etching, for example, etching from the back surface 214 of the wafer W to the pads 216 using a laser beam.

Figure 2C:
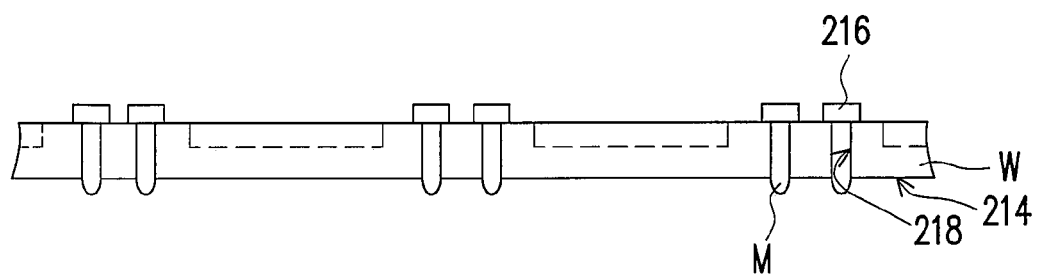

Next, as shown in FIG. 2C, a conductive material M fills the through holes 218 and the conductive material M within each through hole 218 is electrically connected to corresponding one of the pads 216. Furthermore, the conductive material M is exposed and protrudes from the back surface 214 of the wafer W. In the present embodiment, the method of filling the through holes 218 with conductive material M includes printing or plating. Moreover, the conductive material M includes solder or other alloy. It should be noted that the wafer-level chip packaging process in the present embodiment may include a reflow process after filling the through holes 218 with the conductive material M. The conductive material M protruding from the back surface 214 of the wafer W is heated to melt to form a spherical shape in the reflow process.

Figure 2D:
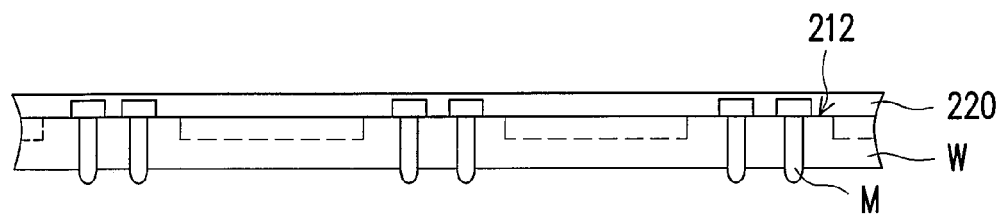

Afterwards, as shown in FIG. 2D, a transparent adhesive layer 220 is formed on the active surface 212. In the present embodiment the method of forming the transparent adhesive layer 220 includes spin coating. Through the centrifugal force provided by the spin-coating machine, the transparent adhesive layer 220 in the liquid state is subjected to an outward radial force from a center such that the possiblity of residual bubbles trapping within the transparent adhesive layer 220 is minimal or negligible. The radial force also controls the thickness of the transparent adhesive layer 220 so that a layer of uniform thickness is formed on the active surface 212. Thus, the transparent adhesive layer 220 not only protects the active surface 212, but also has negligible number of voids or bubbles.

Figure 2E:
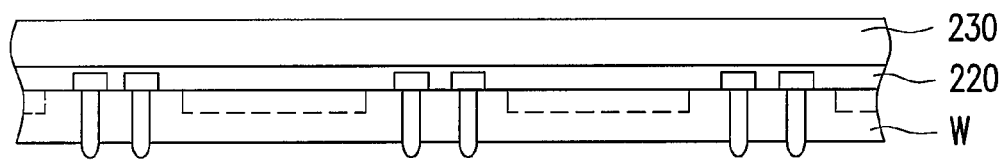

Next, as shown in FIG. 2E, a transparent cover panel 230 is disposed on the transparent adhesive layer 220 so that the transparent cover panel 230 is connected to the wafer W through the transparent adhesive layer 220. In the present embodiment, after the transparent cover panel 230 is disposed on the transparent adhesive layer 220, the transparent adhesive layer 220 can be cured by irradiating ultraviolet rays or heating.

Figure 2F:
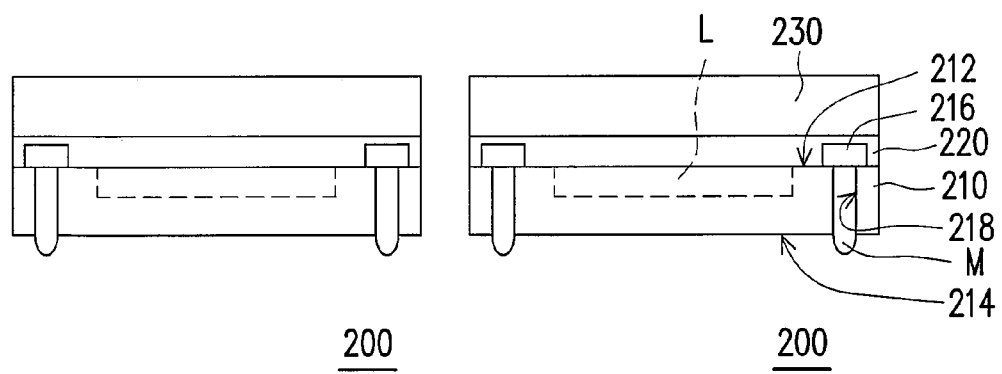

Thereafter, as shown in FIG. 2F, a singulation step is performed such that each chip unit C (as shown in FIG. 2A) with a corresponding part of the transparent cover panel 230 is separated from others to form a plurality of independent chip package structures 200. In the present embodiment, the singulation process is carried out by, for example, running a cutting fixture (not shown) along a scribe line (not shown) between two neighboring chip units C and then performing a breaking process using a machine (not shown).

In the following, a detailed description of a chip package structure 200 is provided. FIG. 2F is a diagram showing the chip package structure according to an embodiment of the present invention. The chip package structure 200 in the present embodiment includes a silicon substrate 210, a transparent adhesive layer 220, and a transparent cover panel 230. The silicon substrate 210 has an active surface 212 and a corresponding back surface 214. The active surface 212 has a plurality of pads 216 and the silicon substrate 210 has a plurality of through holes 218 under the pads 216. Furthermore, a conductive material M is disposed inside the through holes 218 and a portion of the conductive material M protrudes from the back surface 214 of the silicon substrate 210 and forms an end with a spherical or some other shape. In addition, the transparent adhesive layer 220 is disposed on the active surface 212 and the transparent cover panel 230 is disposed on the transparent adhesive layer 220 such that the transparent cover panel 230 is connected to the silicon substrate 210 through the transparent adhesive layer 220.

In the present embodiment, the active surface 212 of the silicon substrate 210 may include a light-sensing area L with a photo diode array (not shown) therein. The light-sensing area L can receive external light signals and convert the light signals into electrical signals. In addition, the transparent adhesive layer 220 has negligible number of residual voids or bubbles and completely encapsulates the active surface 212. Hence, the path of incident light signals may not be adversely affected by the voids or bubbles and the transparent adhesive layer 220 may effectively protect the light-sensing area L.

In addition, the pads 216 can be disposed around the light-sensing area L and electrically connected to the photo diode array. With regard to the material, the material forming the pads 216 includes aluminum, the conductive material M includes solder, and the material forming the transparent cover panel 230 includes, for example, glass or polymethyl methacrylate (PMMA).

In summary, the wafer-level chip packaging process in the present invention has at least the following advantages:

1. In the wafer-level chip packaging process of the present invention, because the transparent adhesive layer formed by the spin-coating method is spread uniformly on the active surface, the probability of having residual voids or bubbles trapped inside the transparent adhesive layer is significantly reduced.

2. In the wafer-level chip packaging process of the present invention, because the transparent adhesive layer formed by the spin-coating method is spread uniformly on the active surface, the transparent adhesive layer may effectively protect the active surface.

3. Because the transparent adhesive layer in the chip package structure of the present invention has negligible number of voids or bubbles, the path of incident light signals may not be adversely affected by the voids or the bubbles.

4. Because the transparent adhesive layer in the chip package structure of the present invention completely encapsulates the active surface, the transparent adhesive layer can fully protect the light-sensing area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer-level chip packaging process, comprising:

providing a wafer having a plurality of chip units, wherein the wafer has an active surface and an opposite back surface, and a plurality of pads are disposed on the active surface;

forming a plurality of through holes under the pads;

filling the through holes with a conductive material such that the conductive material within each through hole is electrically connected to corresponding one of the pads and a portion of the conductive material is exposed and protrudes from the back surface of the wafer;

after filling the through holes, forming a transparent adhesive layer covering the active surface and encapsulating the pads on the active surface;

disposing a transparent cover panel on the transparent adhesive layer such that the transparent cover panel is attached to the wafer through the transparent adhesive layer; and performing a singulation process such that the chip units with a corresponding part of the transparent cover panel is separated form others to form a plurality of independent chip package structures.

2. The wafer-level chip packaging process of claim 1, wherein the step of forming the through holes comprises etching.

3. The wafer-level chip packaging process of claim 1, wherein the step of filling the through holes with a conductive material comprises printing.

4. The wafer-level chip packaging process of claim 1, wherein the step of filling the trough holes with a conductive material comprises plating.

5. The wafer-level chip packaging process of claim 1, wherein the step of forming the transparent adhesive layer comprises spin coating.

6. The wafer-level chip packaging process of claim 1, further comprising a step of curing the transparent adhesive layer after the step of disposing the transparent cover panel on the transparent adhesive layer.

\* \* \* \* \*